US012652064B2

(12) United States Patent
Saber et al.

(10) Patent No.: US 12,652,064 B2
(45) Date of Patent: Jun. 9, 2026

(54) METHOD AND DEVICE FOR SIMPLIFIED SUCCESSIVE CANCELLATION LIST DECODING OF POLARIZATION-ADJUSTED CONVOLUTIONAL (PAC) CODES

(71) Applicant: Samsung Electronics Co., Ltd., Gyeonggi-do (KR)

(72) Inventors: Hamid Saber, San Diego, CA (US); Jung Hyun Bae, San Diego, CA (US); Homayoon Hatami, San Diego, CA (US)

(73) Assignee: Samsung Electronics Co., Ltd (KR)

( * ) Notice: Subject to any disclaimer, the term of this patent is extended or adjusted under 35 U.S.C. 154(b) by 27 days.

(21) Appl. No.: 18/784,446

(22) Filed: Jul. 25, 2024

(65) Prior Publication Data

US 2025/0219657 A1 Jul. 3, 2025

Related U.S. Application Data

(60) Provisional application No. 63/615,824, filed on Dec. 29, 2023.

(51) Int. Cl.
*H03M 13/00* (2006.01)
(52) U.S. Cl.
CPC ............................... *H03M 13/6572* (2013.01)
(58) Field of Classification Search
CPC .................................................. H03M 13/6572
See application file for complete search history.

(56) References Cited

U.S. PATENT DOCUMENTS

2018/0323809 A1* 11/2018 Lin ........................ H04L 1/0053
2022/0103291 A1* 3/2022 Arikan .................. H04L 1/0064

2022/0278698 A1* 9/2022 Koike-Akino ...... G06F 13/4027
2023/0246694 A1 8/2023 Vitthaladevuni et al.
2023/0261908 A1 8/2023 Vitthaladevuni et al.
2023/0299831 A1 9/2023 Manolakos et al.
2023/0336275 A1 10/2023 Alloulah et al.

(Continued)

FOREIGN PATENT DOCUMENTS

| CN | 113131950 | 7/2021 |
| CN | 115085741 | 9/2022 |
| CN | 114157309 | 11/2022 |

(Continued)

OTHER PUBLICATIONS

Amin Alamdar-Yazdi and Frank R. Kschischang; A Simplified Successive-Cancellation Decoder for Polar Codes; IEEE Communications Letters, vol. 15, No. 12, Dec. 2011 (Year: 2011).*
Houren JI et al., "Low-Complexity Fast Fano Decoding for PAC Codes", IEEE Transactions on Vehicular Technology, vol. 72, No. 12, Dec. 2023, 13 pages.

(Continued)

*Primary Examiner* — Joseph D Torres

(74) *Attorney, Agent, or Firm* — The Farrell Law Firm, P.C.

(57) ABSTRACT

Methods and devices are provided in which a channel encoded with a polarization-adjusted convolutional (PAC) code is received. A decoded codeword is generated based at least in part on simplified successive cancellation list (SSCL) decoding performed on the channel via a decoding tree. The decoding tree includes a node that generates candidate codeword output based on predefined processing using convolutional code (CC) state input and channel vector input. A sub-tree of the node remains unprocessed.

18 Claims, 6 Drawing Sheets

(56)                References Cited

U.S. PATENT DOCUMENTS

2023/0361789 A1    11/2023   Kim et al.

FOREIGN PATENT DOCUMENTS

| CN | 116318181 | 6/2023 | |
|----|-----------|--------|--|
| CN | 116436477 | 7/2023 | |
| CN | 117134780 | 11/2023 | |
| WO | WO 2021188513 A1 * | 9/2021 | ........... H03M 13/13 |
| WO | WO 2022/250417 | 12/2022 | |
| WO | WO 2022/257718 | 12/2022 | |
| WO | WO 2022/260469 | 12/2022 | |

OTHER PUBLICATIONS

Samir Kumar Mishra et al., A Modified Q-Learning Algorithm for Rate-Profiling of Polarization Adjusted Convolutional (PAC) Codes, Oct. 5, 2021, 6 pages.
Hongfei Zhu et al., "Fast List Decoders for Polarization-Adjusted Convolutional (PAC) Codes", Dec. 17, 2020, 9 pages.
Hanwen Yao et al., "List Decoding of Arikan's PAC Codes", IEEE International Symposium on Information Theory (ISIT) Jun. 21, 2020, 6 pages.
Erdal Arikan, "From Sequential Decoding to Channel Polarization and Back Again", Aug. 26, 2019, 10 pages.
Hamid Saber et al., "Simplified Successive Cancellation List Decoding of PAC Codes", Jan. 26, 2024, 7 pages.
European Search Report dated Apr. 28, 2025 issued in counterpart application No. 24223154.6-1218, 11 pages.

* cited by examiner

METHOD AND DEVICE FOR SIMPLIFIED SUCCESSIVE CANCELLATION LIST DECODING OF POLARIZATION-ADJUSTED CONVOLUTIONAL (PAC) CODES

CROSS-REFERENCE TO RELATED APPLICATION

This application claims the priority benefit under 35 U.S.C. § 119(e) of U.S. Provisional Application No. 63/615,824, filed on Dec. 29, 2023, the disclosure of which is incorporated by reference in its entirety as if fully set forth herein.

TECHNICAL FIELD

The disclosure generally relates to wireless communication systems. More particularly, the subject matter disclosed herein relates to improvements to channel coding schemes in wireless communication systems.

SUMMARY $5^{th}$ Generation (5G) communication systems have adopted polar codes as a channel coding scheme for control channels due to their modest encoding and decoding complexity.

Polarization-adjusted convolutional (PAC) codes have recently been proposed as a new polar coding scheme. Compared to polar codes, PAC codes encode data with a rate-1 convolutional code (CC) prior to applying a polar transform. Input to the CC encoder includes an information-carrier vector, a state of the encoder, and a generator polynomial. Output from the CC encoder may include a CC codeword and an updated state vector.

Successive cancellation (SC) is one of the most common polar code decoding algorithms. SC decoding operates on a decoding tree in which each node corresponds to a constituent code with a certain information set. SC list (SCL) decoding includes a number of parallel SC decoders that interact with each other at information bits. Unlike SC decoding, two possibilities are considered in SCL decoding. Additionally, in SCL decoding, the list size or number of parallel SC decoders may be expanded and pruned. PAC SCL decoding is similar to polar SCL decoding, with the difference being that, in PAC SCL decoding, two lists are maintained, and for each list member, a CC state and encoder state are stored.

In simplified SC/SCL (SSC/SSCL) decoding of a polar code, at special nodes of a decoding tree, a decoding result may be obtained without processing the sub-tree of the special node. This reduces decoding latency depending on the node type. The special nodes include a rate-0 note, a repetition node, a rate-1 node, and a single parity check (SPC) node. The rate-0 node is defined as a node having leaf nodes that are all frozen or zero-valued bits. A repetition node is defined as a node having frozen leaf nodes except for a last leaf node that includes information or a one-valued bit. A rate-1 node is defined as a node having leaf nodes that all include information or one-valued bits. An SPC node is defined as a node having leaf nodes with information except for a first leaf node that is frozen or a zero-valued bit.

One issue with the above approach is that it is not possible to apply the special node decoding to PAC codes due to the CC encoding. For example, if the special node decoding were applied to PAC codes, the output of a rate-0 node would not be all zero, the output of a repetition node would not be all zero or all 1, the rate-1 node would be a non-linear code requiring special handling, and the output of an SPS node would not be from an SPC codebook.

To overcome these issues, systems and methods are described herein for development of an SSCL decoder for PAC codes considering the four special node types.

Specifically, methods are provided to process the special nodes at the node level considering the impact of CC encoding. The output of a rate-0 node is a constant codeword for each list member. The output of a repetition node is one of two constant codewords for each list member. The output of a rate-1 node may be decoded with techniques available for polar code. A least likelihood ratio (LLR) scrambling method is provided for decoding an SPC node. Methods are also provided to implement inverse CC encoding with lower complexity across the special node lengths.

In an embodiment, a method is provided in which an electronic device receives a channel encoded with a PAC code. A decoded codeword is generated based at least in part on SSCL decoding performed, by the electronic device, on the channel via a decoding tree. The decoding tree includes a node that generates candidate codeword output based on predefined processing using CC state input and channel vector input. A sub-tree of the node remains unprocessed.

In an embodiment, an electronic device is provided that includes a receiver configured to receive a channel encoded with a PAC code. The electronic device also includes a decoder configured to generate a decoded codeword based at least in part on SSCL decoding performed on the channel via a decoding tree. The decoding tree includes a node that generates candidate codeword output based on predefined processing using CC state input and channel vector input. A sub-tree of the node remains unprocessed.

In an embodiment, an electronic device is provided that includes a processor and a non-transitory computer readable storage medium storing instructions that, when executed, cause the processor to receive a channel encoded with a PAC code, and generate a decoded codeword based at least in part on SSCL decoding performed on the channel via a decoding tree. The decoding tree includes a node that generates candidate codeword output based on predefined processing using convolutional code (CC) state input and channel vector input. A sub-tree of the node remains unprocessed.

BRIEF DESCRIPTION OF THE DRAWING

In the following section, the aspects of the subject matter disclosed herein will be described with reference to exemplary embodiments illustrated in the figures, in which.

DETAILED DESCRIPTION

Figure 1:
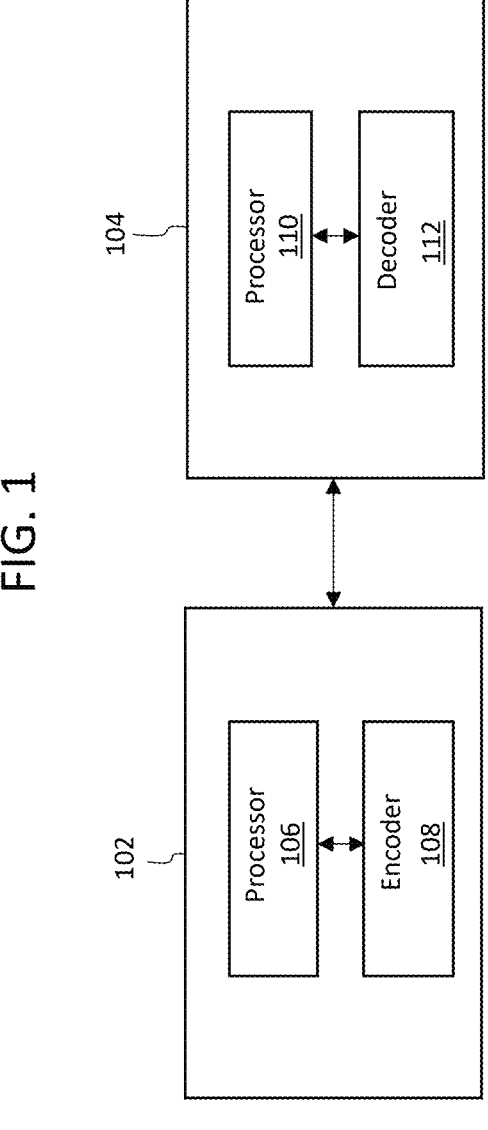
FIG. 1 is a diagram illustrating a communication system, according to an embodiment.

In the following detailed description, numerous specific details are set forth in order to provide a thorough understanding of the disclosure. It will be understood, however, by those skilled in the art that the disclosed aspects may be practiced without these specific details. In other instances, well-known methods, procedures, components and circuits have not been described in detail to not obscure the subject matter disclosed herein.

Reference throughout this specification to "one embodiment" or "an embodiment" means that a particular feature, structure, or characteristic described in connection with the embodiment may be included in at least one embodiment disclosed herein. Thus, the appearances of the phrases "in one embodiment" or "in an embodiment" or "according to one embodiment" (or other phrases having similar import) in various places throughout this specification may not necessarily all be referring to the same embodiment. Furthermore, the particular features, structures or characteristics may be combined in any suitable manner in one or more embodiments. In this regard, as used herein, the word "exemplary" means "serving as an example, instance, or illustration." Any embodiment described herein as "exemplary" is not to be construed as necessarily preferred or advantageous over other embodiments. Additionally, the particular features, structures, or characteristics may be combined in any suitable manner in one or more embodiments. Also, depending on the context of discussion herein, a singular term may include the corresponding plural forms and a plural term may include the corresponding singular form. Similarly, a hyphenated term (e.g., "two-dimensional," "pre-determined," "pixel-specific," etc.) may be occasionally interchangeably used with a corresponding non-hyphenated version (e.g., "two dimensional," "predetermined," "pixel specific," etc.), and a capitalized entry (e.g., "Counter Clock," "Row Select," "PIXOUT," etc.) may be interchangeably used with a corresponding non-capitalized version (e.g., "counter clock," "row select," "pixout," etc.). Such occasional interchangeable uses shall not be considered inconsistent with each other.

Also, depending on the context of discussion herein, a singular term may include the corresponding plural forms and a plural term may include the corresponding singular form. It is further noted that various figures (including component diagrams) shown and discussed herein are for illustrative purpose only, and are not drawn to scale. For example, the dimensions of some of the elements may be exaggerated relative to other elements for clarity.

Further, if considered appropriate, reference numerals have been repeated among the figures to indicate corresponding and/or analogous elements.

The terminology used herein is for the purpose of describing some example embodiments only and is not intended to be limiting of the claimed subject matter. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being on, "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

The terms "first," "second," etc., as used herein, are used as labels for nouns that they precede, and do not imply any type of ordering (e.g., spatial, temporal, logical, etc.) unless explicitly defined as such. Furthermore, the same reference numerals may be used across two or more figures to refer to parts, components, blocks, circuits, units, or modules having the same or similar functionality. Such usage is, however, for simplicity of illustration and ease of discussion only; it does not imply that the construction or architectural details of such components or units are the same across all embodiments or such commonly-referenced parts/modules are the only way to implement some of the example embodiments disclosed herein.

Unless otherwise defined, all terms (including technical and scientific terms) used herein have the same meaning as commonly understood by one of ordinary skill in the art to which this subject matter belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein, the term "module" refers to any combination of software, firmware and/or hardware configured to provide the functionality described herein in connection with a module. For example, software may be embodied as a software package, code and/or instruction set or instructions, and the term "hardware," as used in any implementation described herein, may include, for example, singly or in any combination, an assembly, hardwired circuitry, programmable circuitry, state machine circuitry, and/or firmware that stores instructions executed by programmable circuitry. The modules may, collectively or individually, be embodied as circuitry that forms part of a larger system, for example, but not limited to, an integrated circuit (IC), system on-a-chip (SoC), an assembly, and so forth.

FIG. 1 is a diagram illustrating a communication system, according to an embodiment. In the architecture illustrated in FIG. 1, a transmitting device 102 includes a first processor 106 in communication with an encoder 108. The transmitting device 102 is in communication with a receiving device 104, which includes a second processor 110 and a decoder 112. The encoder 108 may encode messages (or messagewords) into codewords that are sent from the transmitting device 102 to the receiving device 104. The decoder 112 may decode received codewords into messages (or messagewords) at the receiving device 104.

Figure 2:
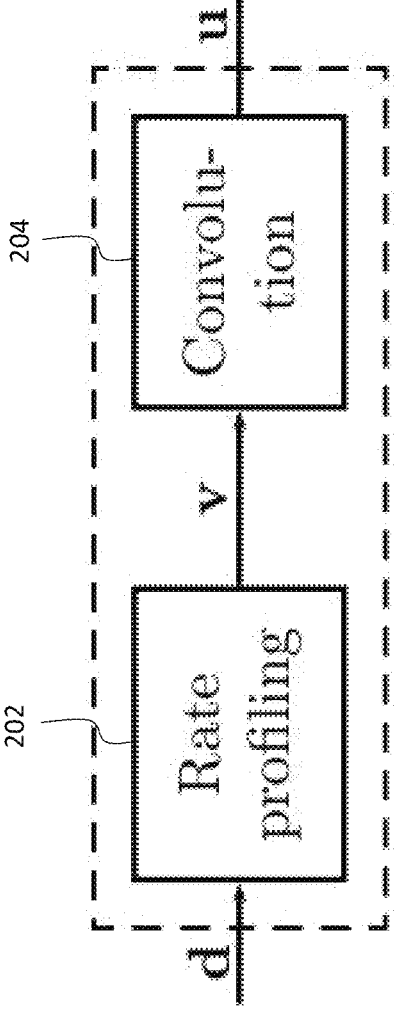
FIG. 2 is a diagram illustrating a PAC encoder, according to an embodiment.

FIG. 2 is a diagram illustrating a PAC encoder, according to an embodiment. A message word $$d_1^K$$

may be rate profiled at first block 202 to a $$\text{length} - N = 2^n \text{ word } v_1^N.$$

Rate profiling refers to the determination of K indices in vector v and the placement of K message bits in those indices of vector v. Specifically, vector v has K message bits and N−K frozen bits with zero values. The information bit indices are provided by an information set $\mathcal{A}$ of cardinality K. The frozen set is denoted as $\mathcal{F} = \{1, \ldots, N\} \backslash \mathcal{A}$. A rate-1 convolutional encoder with generator polynomial $g = (g_0, \ldots, g_m)$ may be applied on vector v at second block 204, which outputs a length-N vector $$u_1^N.$$

With respect to the generator polynomial, $g_0 = g_m = 1$. The parameter m is the number of memory units of the convolutional code and m+1 is the constraint length. This results in Equation (1) below.

$$u_i = \sum_{j=0}^{i-1} g_j v_{i-j}. \tag{1}$$

Equivalently, $$u_1^N = v_1^N \cdot G_{CC},$$

resulting in Equation (2) below.

$$G_{cc} = \begin{bmatrix} g_0 & \cdots & g_m & 0 & \cdots & 0 \\ 0 & g_0 & \cdots & g_m & 0 & 0 \\ 0 & 0 & g_0 & \cdots & g_m & 0 \\ 0 & 0 & 0 & g_0 & \cdots & g_m \\ 0 & 0 & 0 & 0 & g_0 & \cdots \\ 0 & 0 & 0 & 0 & 0 & g_0 \end{bmatrix} \tag{2}$$

Another equivalent description may be provided through a state vector and an input bit at a given time. The state vector is a length-m vector that contains the input bits to the convolutional encoder. At time i, when the input to the encoder is $v_1$, the state vector is $State_i = (v_{i-1}, \ldots, v_{i-m})$. The output bit $u_i$ may be determined from the input bit $v_i$, the current state vector, and the generator polynomial of the code $g$. This function may be referred to as ConvTrans(·) and also returns the next state, as shown in Equation (3) below.

$$(u_i, \text{next\_State}) = ConvTrans(v_i, \text{current\_State}, g) \tag{3}$$

A generator matrix of length-N($N=2^n$) polar code may be $$G_N = F^{\otimes n} \text{ where } F = \begin{bmatrix} 1 & 0 \\ 1 & 1 \end{bmatrix}.$$

Vector u may then be encoded using a polar code of length N to obtain a final codeword $c = (c_1, \ldots, c_N) = uG_N$. A received word at the output of the channel may be denoted as $y = (y_1, \ldots, y_N)$.

SC decoding of PAC codes is similar to SC decoding of polar codes. With respect to SC decoding of polar codes, a polar code of length N and message word length K may be associated with an information set $\mathcal{A}_N$ of cardinality K containing indices of information bits, which in turn determines the N−K indices of frozen bits, which are always set to zero. An SC polar decoder takes a channel LLR vector $(\lambda_1, \ldots, \lambda_N)$ and the information set as input, and outputs a decoded message word û that contains the K decoded message bits at the indices given by the information set and N−K zero-valued bits at the indices given by the frozen set. The SC decoder may be defined recursively as follows.

To obtain $û = SC_{dec}(\lambda_1, \ldots, \lambda_N, \mathcal{A}_N)$, a length-N/2 upper polar code may be decoded with inputs to the SC decoder, as shown in Equations (4) and (5) below.

$$\left(\lambda_1^{(up)}, \ldots, \lambda_{\frac{N}{2}}^{(up)}\right), \text{ and } \mathcal{A}_{\frac{N}{2}}^{(up)} \tag{4}$$

where $$\lambda_i^{(up)} = \lambda_i \boxplus \lambda_{i+N/2} \tag{5}$$

The operator $\boxplus$ is a box-plus operator, also referred to as a check-node operator, which is defined as $$x \boxplus y = 2 \tanh^{-1}\left(\tanh\frac{x}{2} \cdot \tanh\frac{y}{2}\right).$$

The check-node operator may also be defined as an approximation of Equation (6) below.

$$x \boxplus y = \text{Sign}(x)\text{Sign}(y) \cdot \min(|x|, |y|) \tag{6}$$

where Sign(α) is equal to 1 for α>0 and −1 for α<0.

The set $$\mathcal{A}_{\frac{N}{2}}^{(up)}$$

may be defined as $$\mathcal{A}_{\frac{N}{2}}^{(up)} = \left\{i \mid i \in \mathcal{A}_N, i \le \frac{N}{2}\right\}.$$

Once the upper code is decoded and the decoded message word $û^{(up)}$ is obtained, it may be encoded by $G_{N/2}$ to obtain the corresponding codeword as $$ĉ^{(up)} = û^{(up)} G_{N/2} = \left(ĉ_1^{(up)}, \ldots, ĉ_{N/2}^{(up)}\right).$$

A lower length-N/2 polar code may then be decoded with inputs to the SC decoder, as shown in Equations (7) and (8) below.

$$\left(\lambda_1^{(lo)}, \ldots, \lambda_{\frac{N}{2}}^{(lo)}\right) \text{ and } \mathcal{A}_{\frac{N}{2}}^{(lo)} \tag{7}$$

where $$\lambda_1^{(lo)} = \left(1 - 2ĉ_1^{(up)}\right)\lambda_i + \lambda_{i+N/2} \tag{8}$$

The set $$_r\mathcal{A}_{\frac{N}{2}}^{(lo)}$$

may be defined as $$_r\mathcal{A}_{\frac{N}{2}}^{(lo)} = \left\{ i - \frac{N}{2} \in \middle| i \in A_N, i > \frac{N}{2} \right\}.$$

This decoder may provide the decoded message word as $\hat{u}^{(lo)}$. The final decoding output for the length-N polar code may then be obtained as shown in Equation (9) below.

$$\hat{u} = \left( \hat{u}^{(up)}, \hat{u}^{(up)} \right) \tag{9}$$

The above-described recursive decoder may stop at length N=1 for which the rule of Equation (10) may be used for decoding.

$$\hat{u}_1 = \begin{cases} 0 & i \notin {}_z\mathcal{A}_1 \\ \dfrac{1 - \operatorname{Sign}(\lambda_1)}{2} & i \in {}_z\mathcal{A}_1 \end{cases} \tag{10}$$

Figure 3:
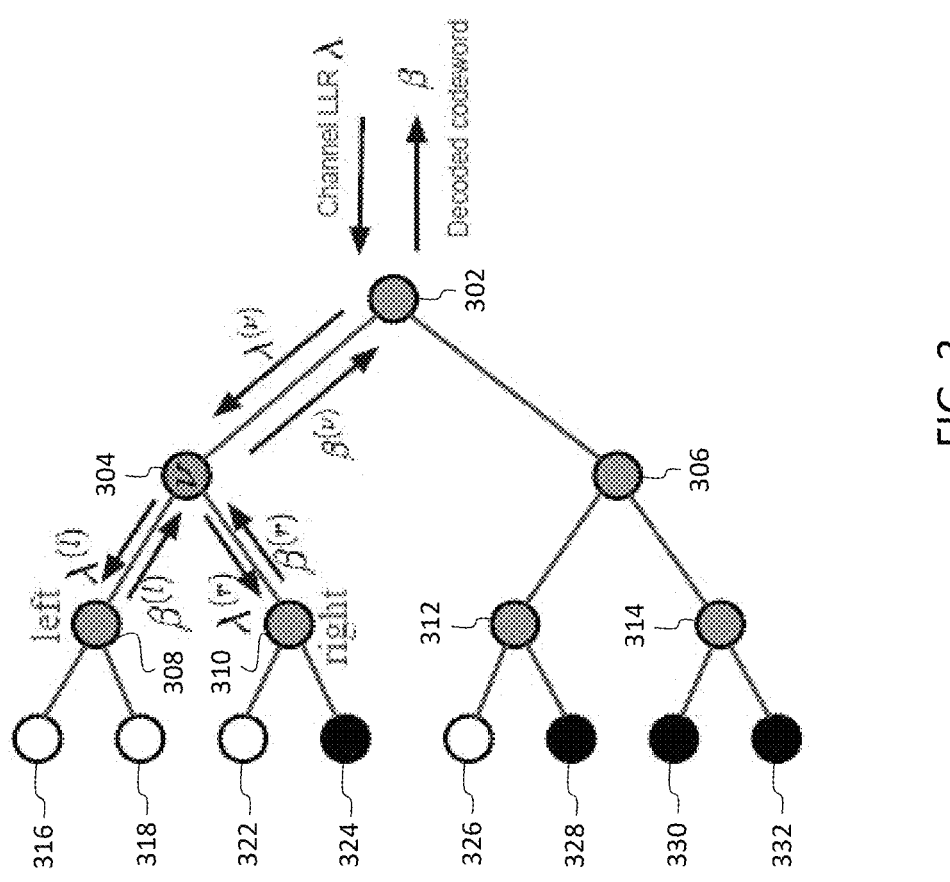
FIG. 3 is a diagram illustrating a decoding tree for a polar code, according to an embodiment.

FIG. 3 is a diagram illustrating a decoding tree for a polar code, according to an embodiment. The above-described SC decoding may also be viewed as operating on the decoding tree. The decoding tree of FIG. 3 may be a length-8 decoding tree, or a portion of larger decoding tree. For a length-8 decoding tree, a length-8 polar code may correspond to a first node 302. Second and third nodes 304 and 306, to the immediate left of the first node 302, may each correspond to a length-4 polar code. Fourth, fifth, sixth, and seventh nodes 308, 310, 312, and 314 may each correspond to a length-2 polar code. Eighth, ninth, tenth, eleventh, twelfth, thirteenth, fourteenth, and fifteenth nodes 316, 318, 320, 322, 324, 326, 328, and 330, at the leftmost side of the decoding tree, may each correspond to a length-1 polar code, and may be referred to as leaf nodes. SC decoding may be viewed as processing every node in the decoding tree in a specific order, starting from the rightmost length-N node 302. A length $N=2^n$ polar code has a decoding tree with n+1 columns where there are 1 length-N node at the rightmost column, 2 length-N/2 nodes at the second rightmost column, and so on. The leftmost column has N nodes corresponding to length-1 polar codes. Channel LLR $\lambda^{(i)}$ is provided downstream through the nodes and candidate decoded codewords $\beta^{(i)}$ are provided upstream through the nodes.

SC decoding of PAC codes is essentially the same as SC decoding of polar codes with an additional step to consider for the CC encoder. Additionally, a CC encoder is run at the SC decoder. The CC encoder may be realized by a sequential calling of Equation (3).

The SC decoder may initialize the states of the CC encoder as all-zero. The decoding proceeds as it does for polar codes. Once the LLR $\lambda^{(i)}$ is calculated at the bit index, i, $v_i$ and $u_i$ may be determined according to one of the cases below.

In a first case, $i \notin \mathcal{A}_N$:$(u_i,\text{next\_State})=\text{ConvTrans}(v_i=0,$ current\_State,$g$ ). Then current\_State may be set as next\_State.

In a second case, $i \in \mathcal{A}_N$, two possibilities may be considered for $v_i$=0, and $v_i$ and $u_i$ is calculated for each as shown in Equations (11) and (12) below.

$$\left( u_i^{(0)}, \text{next\_State\_0}) \right) = ConvTrans(v_i = 0, \text{current\_State}, g) \tag{11}$$

$$\left( u_i^{(1)}, \text{next\_State\_1}) \right) = ConvTrans(v_i = 1, \text{current\_State}, g) \tag{12}$$

$v_i$ may then be determined as shown in Equation (13) below.

$$v_i = \begin{cases} 0 & (1 - 2u_i^{(0)})\lambda_i \geq 0 \\ 1 & (1 - 2u_i^{(0)})\lambda_i < 0 \end{cases} \tag{13}$$

and $$u_i = u_i^{(v_i)}.$$

The CC state may also be updated as next\_State\_0 if $v_i$=0, and otherwise, as next\_State\_1.

SSC decoding of polar codes takes advantage of the special nature of the code corresponding to a node in the decoding tree, so as to avoid the necessity of traversing all the way down to the leaf nodes and calculate the LLRs at the information bits. In case of a special node, SC decoding may be temporarily taken over by the decoder of the special node until the special decoding results are passed to the SC decoder, at which point SC decoder may resume.

For example, a polar code of length 16 may include four polar codes of length 4, each with their corresponding rates. A complete decoding tree for this code has five columns of nodes, with 16 nodes at the left most column.

Typically, at node i, the SC decoder may proceed to the leaf nodes (each node #i has two more levels of branching resulting in eight leaf nodes in FIG. 3). However, if the code corresponding to the node is considered special, then traversing to the leaf nodes may be avoided.

For example, referring to FIG. 3, the fourth node 308 may be considered a rate-0 (or all-zero) special node because the information/frozen pattern for the corresponding leaf nodes 318 and 320 are each frozen or a zero-valued bit. The second node 304 may be considered a repetition special node because the information/frozen pattern for the corresponding leaf nodes 318, 320, 322, and 324 are frozen or zero-valued bits for all but the last leaf node 326, which has information or a one-valued bit. The seventh node 314 may be considered a rate-1 special node because the information/frozen pattern for the corresponding leaf nodes 328 and 330 are each information or a one-valued bit. The third node 306 may be considered an SPC special node because the information/frozen pattern for the corresponding leaf nodes 324, 326, 328, and 330 is information or one-valued bit for all but the first leaf node 324, which is frozen or a zero-valued bit.

As the code at the second node 304 is a repetition code of length-4, two possible codewords may be decoded at the node level, by only calculating a machine-learning (ML) metric for codeword (0,0,0,0) and (1,1,1,1). The path metrics may also be calculated at the node level. The output of the special decoder may be passed to the SC decoder, which proceeds to the third code corresponding to the third node 306.

The SCL decoding of polar codes is based on the idea that at each information bit index, a final decision is not made, but rather a list of possibilities based on the two values of the bits are considered. In particular, SCL decoding with a list size of L, stores a list of size L after decoding the bit index i. The list has L path members, each having a length i, containing decoded values of bits $u_1, \ldots, u_i$. At frozen bits, the list may be expanded by padding zero to the current list, making it one unit longer. Path metrics may be updated for each member of the new list. At information bits, the current list may be expanded to give a list of 2L paths by appending 0 and 1 to each path in the list. A path metric is calculated for each of the 2L new paths. The L paths with the smallest metrics may be kept in the list, while the L paths with the largest metrics may be removed from the expanded list, resulting in a new list of size L, containing members which are 1 bit longer than the previous list. This process may continue until the length of the paths in the list reaches N. At this step, the path with the smallest metric is chosen as the final candidate (i.e., decoder output).

SCL decoding of polar codes may be improved by appending cyclic redundancy check (CRC) to the message word u. The resulting decoding scheme may be referred to as CRC-aided SCL (CA-SCL) decoding. Compared to SCL decoding, CA-SCL decoding may select the final decoded word from the final list given at the bit index N, as the path with smallest path metric that satisfies the CRC.

SCL decoding of PAC codes is essentially the same as SCL decoding of polar codes with the modification that L running CC encoders are kept at the decoder. Two lists are stored for v and u. The list expansion at the frozen bits for SCL decoding of PAC codes is performed in a manner similar to that for SC decoding of PAC codes. Similarly, at the information bits, the list may be expanded by considering two possibilities 0 and 1 for the v list and obtaining the corresponding expanded u list. The path metrics may be calculated based on the calculated LLRs and the u list. The remainder of the procedure is similar to SCL decoding of polar codes. CA-SCL decoding of PAC codes is with the modification of the SCL decoding, where the modification is based on the appended CRC as described in the CA-SCL decoding of polar codes.

According to an embodiment, an SSCL decoding algorithm is proposed for the PAC codes, which defines how to process a special node for the PAC code in SCL decoding. After processing bit number i, an SCL decoder may have L (list size) path members of v (referred to as v-list), L path members of u (referred to as u-list), corresponding path metrics (PMs), intermediate LLRs, and encoded message bits for each path member in the decoding graph. The decoder may process a special node of length $M=2^m$ with a starting index i for a first bit the decoding tree. For each path member that is of size i−1 bits, simplified processing of the next node may be performed. For each path member prior to processing of the special node, the decoder may have information including a estate vector Curr_State, the LLR vector at the output of the node, $\lambda_0, \ldots, \lambda_{M-1}$, and path metric value PM.

Figure 4:
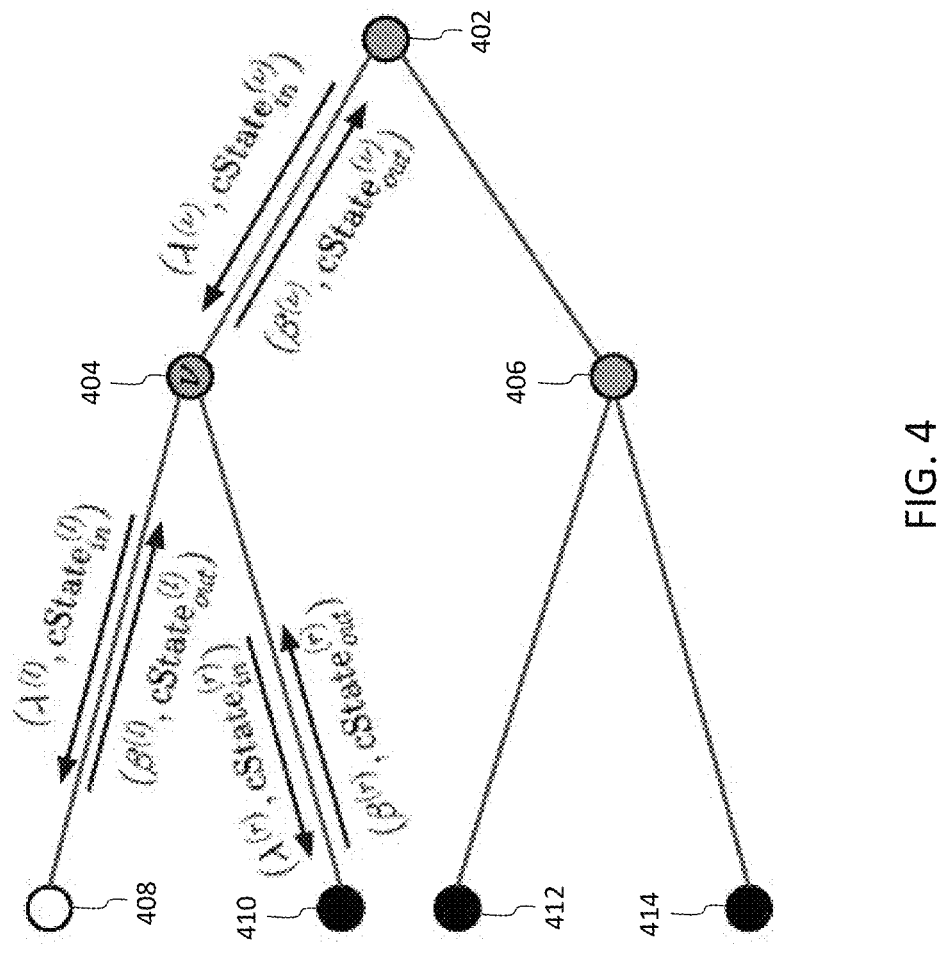
FIG. 4 is a diagram illustrating a decoding tree for a PAC code, according to an embodiment.

FIG. 4 is a diagram illustrating a decoding tree for a PAC code, according to an embodiment. Unlike the decoding tree for polar code shown in FIG. 3, an input CC state ($cState_{in}$) and an output CC state ($cState_{out}$) are provided to and from the nodes of the decoding tree for PAC code. The decoding tree of FIG. 4 may be a length-4 decoding tree or a portion of a larger decoding tree. For a length-4 decoding tree, a length-4 PAC code may correspond to a first node 402. Second and third nodes 404 and 406, to the immediate left of the first node 402, may each correspond to a length-2 PAC code. Fourth, fifth, sixth, and seventh nodes 408, 410, 412, and 414, at the leftmost side of the decoding tree, may each correspond to a length-1 PAC code, and may be referred to as leaf nodes. An individual node (e.g., the second node 404) may receive a channel LLR $\lambda^{(i)}$ vector and a current CC state $cState_{in}$ from the first node 402. The node may output (e.g., to the first node 402) a candidate codeword $\beta^{(i)}$ and a next CC state $cState_{out}$ (as well as vector u and vector v).

The input to the CC encoder may be $v=[v_0, \ldots, v_{M-1}]$ and the output of the CC may be $u=[u_0, \ldots, u_{M-1}]$. The codeword at the output of the special node may be denoted by $c=[c_0, \ldots, c_{M-1}]F^{\otimes m}$.

A node may be considered an all-zero special node if the information/frozen pattern at that node is an-all-zero vector of length M. The input to the CC may be a length-M word v=0.

The list may be expanded by appending a polar codeword corresponding to the output of the CC to the list member. The output of CC, v, is calculated as set forth in Equation (14) below.

$$
\begin{aligned}
&\text{Current\_state\_l= Curr\_State //the state prior to processing the node.} \\
&\text{For j = 0: M − 1} \\
&\quad (u_i, \text{Current\_state\_l}) \leftarrow \text{ConvTrans}(v_i, \text{Current\_state\_l}, g) \\
&\text{Return u}
\end{aligned} \tag{14}
$$

Subsequently, u may be encoded to obtain $c=u. G_M$. The expanded path may be determined by concatenating v, u to the v-list and u-list, respectively.

The new path metric $PM_0$ may be calculated as shown in Equation (15) below.

$$PM_0 \leftarrow PM + \sum_{i=0}^{M-1} \frac{1 - \text{Sign}((1 - 2c_i)\lambda_i)}{2}|\lambda_i| \tag{15}$$

A node may be considered a repetition special node if the information/frozen pattern at that node is all zero in the first M−1 indices and 1 at the last index. The input to the CC may be a length-M word v, resulting in $v=[0_{1 \times M-1}, v_{M-1}]$.

For two possibilities of $v_{M-1}=0,1$, v-list may be expanded by concatenating $$v^{(0)} = [v_0^{(0)}, \ldots,$$

$$v_{M-1}^{(0)}] = [0_{1 \times M-1}, 0] \text{ and } v^{(1)} = [v_0^{(1)}, \ldots, v_{M-1}^{(1)}] = [0_{1 \times M-1}, 1]$$

to a current v-list, resulting in two child paths. To obtain the u-list, the output of CC for the two possibilities may be calculated as set forth in Equation (16) below.

$$
\begin{aligned}
&\text{For l = 0: 1} \\
&\quad \text{Current\_state\_l= Curr\_State //the state prior to processing the node:} \\
&\quad \text{This is same for both l = 0 and 1} \\
&\quad \quad \text{For j = 0: M − 1} \\
&\quad \quad \quad (u_i^{(l)}, \text{Curr\_State\_l}) \leftarrow \text{ConvTrans}(v_i^{(l)}, \text{Curr\_State\_l}, g) \\
&\quad \quad u^{(l)} = [u_0^{(l)}, \ldots, u_{M-1}^{(l)}] \\
&\text{Return } u^{(0)} \text{ and } u^{(1)}
\end{aligned} \tag{16}
$$

As an alternative, $u^{(0)}$ may be calculated according to the procedure above. $u^{(1)}$ is identical to $u^{(0)}$ except for the last element where $$u_{M-1}^{(1)} = u_{M-1}^{(0)} + 1$$

(GF field or mode 2 operation) because g=1.

The u-list may be expanded by concatenating $u^{(0)}$ and $u^{(1)}$ to a current u-list.

The path metrics of the two child paths, denoted by $PM_0$ and $PM_1$ may be calculated as shown in Equation (17) below.

$$PM_l \leftarrow PM + \sum_{i=0}^{M-1} \frac{1-\mathrm{Sign}\left((1-2c_i^{(l)})\lambda_i\right)}{2}|\lambda_i| \qquad (17)$$

where $$c^{(l)} = \left[c_0^{(l)}, \dots, c_{M-1}^{(l)}\right] = u^{(l)}G_M$$

is the codeword at the output of special node (i.e., after applying polar transform).

It may also be possible to only perform polar encoding once and obtain $c^{(0)}$, and calculate $c^{(1)}$ from $c^{(0)}$ as follows. Since $u^{(0)}$ and $u^{(1)}$ except for the last element for which $$u_{M-1}^{(1)} = u_{M-1}^{(0)} + 1,$$

it may be shown that $c^{(1)}=c^{(0)}+1$, where 1 is a length-M all-1 vector.

A node may be considered a rate-1 special node if the information/frozen pattern at that node is all-one. The input to the CC may be a length-M word v, resulting in $v=[v_0, \dots, v_{M-1}]$, where all $v_i$ are message bits from the message word $$d_1^K.$$

The codeword at the output of the special node, after polar transformation, c, may take any arbitrary vector in $\{0,1\}^M$. That is, a rate-1 code is provided even in the presence of the CC code. $u_i$ is a linear combination of $v_j, j \le i$ and the coefficient of the $v_i$ is equal to 1, due to g=1. Therefore, u may be written as Equation (18) below.

$$u = vG_{cc} + \eta \qquad (18)$$

where $\eta=[\eta_0, \dots, \eta_{M-1}]$ is a constant vector, whose elements are determined as a linear combination of the elements of the current path member, and $G_{cc}$ is the generator matrix of the CC code, which is invertible and upper triangular. Therefore, u may be an arbitrary vector in $\{0,1\}^M$. Since $c=uG_M$, the same statement holds for c. The child path members may then be produced by having most likely estimated word $c^{(0)}, c^{(1)}, \dots, c^{(Z-1)}$ for Z child paths expansion.

The generation of child paths at the output of the special node after applying the polar transform may be performed according to the classical polar codes, as shown in Equation (19) below.

$$\left[c^{(0)}, c^{(1)}, \dots, c^{(Z-1)}\right] = \mathrm{Classical\_polar\_Rate1\_dec}(\lambda_0, \dots, \lambda_{M-1}) \qquad (19)$$

The routine Classical_polar_Rate1 may take the M channel LLRs and output the most likely codewords of a rate-1 code. For example, the most likely codeword may be the result of hard decision on the LLRs. The second most likely codeword may be obtained by flipping a sign of smallest absolute value LLR and then taking hard decision. The third most likely codeword may be obtained by flipping the sign of the second smallest absolute value LLR. The fourth most likely codeword may be obtained by flipping the sign of the third smallest absolute value LLR, or flipping the signs of both the smallest and second smallest absolute value LLR.

The path metric $PM_l$ corresponding toe each of the $c^{(l)}$ may be calculated as shown in Equation (20) below.

$$PM_l \leftarrow PM + \sum_{i=0}^{M-1} \frac{1-\mathrm{Sign}\left((1-2c_i^{(l)})\lambda_i\right)}{2}|\lambda_i| \text{ for } l = 0, \dots, Z-1 \qquad (20)$$

For the expansion of the u-list and v-list, the corresponding $u^{(l)}$ and $v^{(l)}$ vectors that are mapped to $c^{(l)}$ may be calculated in three steps.

In a first step, $u^{(l)}$ may be calculated. Since $c^{(l)}=u^{(l)}G_M$ and $$G_m^{-1} = G_m,$$

as a property of polar generator matrix, Equation (21) may be conducted by a length-M polar encoding.

$$u^{(l)} = c^{(l)}G_M \qquad (21)$$

In a second step, the scrambling word $\eta$ may be calculated. The word $\eta$ may be referred to as a scrambling word as it scrambles the output of the CC encoder that would have been obtained if the encoder started at an all-zero state. To calculate $\eta$, CC may be a linear operator. Therefore, $\eta$ may be equal to the output of the CC encoder for a length-M all-zero input word and initial encoder state given by Curr_State, as shown in Equation (22) below.

$$\mathrm{Current\_state\_1} = \mathrm{Curr\_State}. \qquad (22)$$

$$\text{For } j = 0{:}M-1$$

$$(\eta_i, \mathrm{Curr\_State\_1}) \leftarrow ConvTrans(0, \mathrm{Curr\_State\_1}, g)$$

$$\mathrm{Return} \ \eta = [\eta_0, \dots, \eta_{M-1}]$$

In a third step, $v^{(l)}$ may be calculated. Equations (23) and (24) are provided below.

$$u^{(l)} = v^{(l)}G_{cc} + \eta, \text{ or} \qquad (23)$$

$$\tilde{u}^{(l)} = v^{(l)}G_{cc} \qquad (24)$$

where $\tilde{u}^{(l)} = u^{(l)} + \eta$, solving the Equation for $v^{(l)}$ given $\tilde{u}^{(l)}$.

According to a first solution using an inverse of $G_{cc}$, since $G_{cc}$ is of size M×M and full-rank, it may be invertible. The inverse matrix may be calculated offline and stored for each special node length M. The $v^{(l)}$ may then be calculated as $$v^{(l)} = \tilde{u}^{(l)} G_{cc}^{-1}.$$

According to a second solution using a shift register, numerical results may demonstrate that $$G_{cc}^{-1}$$

has the same structure as $G_{cc}$. In particular, both are Toeplitz matrices. That is, it may be described via a convolutional code generator polynomial. An example is shown in Equations (25) and (26) below for $g = (1,0,0,1)$ and M=8.

$$G_{cc} = \begin{bmatrix} 1 & 0 & 0 & 1 & 0 & 0 & 0 & 0 \\ 0 & 1 & 0 & 0 & 1 & 0 & 0 & 0 \\ 0 & 0 & 1 & 0 & 0 & 1 & 0 & 0 \\ 0 & 0 & 0 & 1 & 0 & 0 & 1 & 0 \\ 0 & 0 & 0 & 0 & 1 & 0 & 0 & 1 \\ 0 & 0 & 0 & 0 & 0 & 1 & 0 & 0 \\ 0 & 0 & 0 & 0 & 0 & 0 & 1 & 0 \\ 0 & 0 & 0 & 0 & 0 & 0 & 0 & 1 \end{bmatrix} \quad (25)$$

$$G_{cc}^{-1} = \begin{bmatrix} 1 & 0 & 0 & 1 & 0 & 0 & 1 & 0 \\ 0 & 1 & 0 & 0 & 1 & 0 & 0 & 1 \\ 0 & 0 & 1 & 0 & 0 & 1 & 0 & 0 \\ 0 & 0 & 0 & 1 & 0 & 0 & 1 & 0 \\ 0 & 0 & 0 & 0 & 1 & 0 & 0 & 1 \\ 0 & 0 & 0 & 0 & 0 & 1 & 0 & 0 \\ 0 & 0 & 0 & 0 & 0 & 0 & 1 & 0 \\ 0 & 0 & 0 & 0 & 0 & 0 & 0 & 1 \end{bmatrix} \quad (26)$$

This corresponds to a CC with generator polynomial $g^{-1} = (1,0,0,1,0,0,1)$. If this is always the case, as described in greater detail below, the inverse generator polynomial may be found offline and then used to encode $\tilde{u}^{(l)}$ and obtain $v^{(l)}$.

Once $v^{(l)}$ and $u^{(l)}$ are calculated for l=0, . . . , Z−1, they may be appended to the current path member to obtain z child path members.

A node may be considered an SPC special node if the information/frozen pattern at that node is all-one except for the first index which is 0. The input to the CC may be a length-M word v, resulting in $v = [v_0, \ldots, v_{M-1}]$, where all the $v_i$ are message bits from the message word $$d_1^K$$

except for $v_0 = 0$.

Similar to the analysis for rate-1 node, Equation (27) is provided below.

$$u = vG_{cc} + \eta \quad (27)$$

where $\eta = [\eta_0, \ldots, \eta_{M-1}]$ is a constant vector, whose elements are determined as a linear combination of the elements of the current path member, and $G_{cc}$ is the generator matrix of the CC code which is invertible and upper triangular. $\eta$ may be determined as described for rate-1 node.

Encoding u with the polar code corresponding to the special node, results in the codeword set forth in Equation (28) below.

$$c = uG_M = (vG_{cc} + \eta)G_M = vG_{cc}G_M + \eta G_M \quad (28)$$

$$c = v_{cc}G_M + \eta_c$$

The vector $v_{cc} = vG_{cc}$ has its first element as frozen (i.e., it always takes zero value). The first element is equal to $v_0$ $g_0 = 0 \cdot g_0 = 0$.

Defining $\tilde{c} = (\tilde{c}_0, \ldots, \tilde{c}_{M-1})$ c+$\eta_c$ results in $\tilde{c} = v_{cc}G_M$, which is a codeword of the SPC code. The child path members may then be calculated using methods for classical polar codes with an additional LLR scrambling with the binary sequence $\eta_c$. Steps for child path member generation are set forth below.

In a first step, a coded scrambling vector $\eta_c$ may be calculated. $\eta$ may be calculated as described above. $\eta_c = (\eta_{c,0}, \ldots, \eta_{c,M-1})$ may be calculated via polar encoding as $\eta_c = \eta G_M$.

In a second step the LLRs may be scrambled. The LLR vector $(\lambda_0, \ldots, \lambda_{M-1})$ may be scrambled with $\eta_c$ to obtain scrambled LLRs $(\tilde{\lambda}_0, \ldots, \tilde{\lambda}_{M-1})$, which correspond to the scrambled codeword $\tilde{c}$. Scrambling may be performed as $\tilde{\lambda}_i = (1 - 2\eta_{c,i})\lambda_i$. Methods for generation of child members of SPC code for classical polar code may be used to obtain Z child members as shown in Equation (29) below.

$$\left[ \tilde{c}^{(0)}, \tilde{c}^{(1)}, \ldots, \tilde{c}^{(Z-1)} \right] = \text{Classical\_polar\_SPC\_dec}(\tilde{\lambda}_0, \ldots, \tilde{\lambda}_{M-1}) \quad (29)$$

where $$\tilde{c}^{(l)} = \left( \tilde{c}_0^{(l)}, \ldots, \tilde{c}_{M-1}^{(l)} \right)$$

is the candidate for list member index l.

The corresponding path metrics $PM_l$ are a function of PM and scrambled LLRs $(\tilde{\lambda}_0, \ldots, \tilde{\lambda}_{M-1})$. The path metric $PM_l$ corresponding to each of the $\tilde{c}^{(l)}$ is calculated as shown in Equation (30) below.

$$PM_l \leftarrow PM + \sum_{i=0}^{M-1} \frac{1 - \text{Sign}\left( (1 - 2\tilde{c}_i^{(l)})\tilde{\lambda}_i \right)}{2} |\lambda_i| \text{ for } l = 0, \ldots, Z-1. \quad (30)$$

In a third step, $v_{cc}$ may be calculated as $$v_{cc}^{(l)} = \tilde{c}^{(l)} G_M$$

for l=0, . . . , Z−1.

In a fourth step, v-list may be calculated. From $v_{cc} = vG_{cc}$, Equation (31) may be calculated as shown below.

$$v^{(l)} = v_{cc}^{(l)} G_{cc}^{-1} \text{ for } l = 0, \ldots, Z-1 \quad (31)$$

As described above, the computation may be calculated with low complexity via shift registers without any matrix multiplication. The application of $$Classical_{polarSPC_{dec(.)}}$$

ensures that the first element of $$v_{cc}^{(l)}$$

and in turn the first element of $v^{(l)}$ is zero for every l.

The expanded path v-list may be obtained by concatenating $v^{(l)}$ to the current v-list for l=0, . . . Z−1.

In a fifth step, u-list may be calculated. To calculate the expanded path u-list, $u^{(l)}$ may first be calculated as set forth in Equation (32) below.

$$\text{For } l = 0{:}Z - 1 \qquad (32)$$

$$Current\_state\_l = Curr\_State \; //$$

the state prior to processing the node: This is same for all child path $$index \; l$$

$$\text{For } j = 0{:}M - 1$$

$$\left(u_i^{(l)}, Curr\_State\_l\right) \leftarrow ConvTrans\left(v_i^{(l)}, Curr\_State\_l, g\right)$$

$$u^{(l)} = \left[u_0^{(l)}, \dots, u_{M-1}^{(l)}\right]$$

$$Return \; u^{(0)}, \dots, u^{(Z-1)}$$

Alternatively, $u^{(l)}$ may be calculated as $$u^{(l)} = v_{cc}^{(l)} + \eta$$

for l=0, . . . , Z−1.

The expanded path u-list may be obtained by concatenating $u^{(l)}$ to the current u-list for l=0, . . . Z−1.

With respect to inverse operation of the CC encoder, the task of finding the input vector to the rate-1 CC encoder from the encoded output vector may be performed via another CC encoder (i.e., shift register and linear time). In particular, the inverse of Equation (33) takes the form of Equation (34), as shown below.

$$G_N = \begin{bmatrix} g_0 & \cdots & g_m & 0 & \cdots & 0 \\ 0 & g_0 & \cdots & g_m & 0 & 0 \\ 0 & 0 & g_0 & \cdots & g_m & 0 \\ 0 & 0 & 0 & g_0 & \cdots & g_m \\ 0 & 0 & 0 & 0 & g_0 & \cdots \\ 0 & 0 & 0 & 0 & 0 & g_0 \end{bmatrix} \qquad (33)$$

$$G_N^{-1} = \begin{bmatrix} \alpha_0 & \cdots & \alpha_m & 0 & \cdots & \alpha_{N-1} \\ 0 & \alpha_0 & \cdots & \alpha_m & 0 & 0 \\ 0 & 0 & \alpha_0 & \cdots & \alpha_m & 0 \\ 0 & 0 & 0 & \alpha_0 & \cdots & \alpha_m \\ 0 & 0 & 0 & 0 & \alpha_0 & \cdots \\ 0 & 0 & 0 & 0 & 0 & \alpha_0 \end{bmatrix} \qquad (34)$$

This inversion may be proven by induction. Note that $g_0 = g_m = 1$, and $\alpha_0 = 1$ since $G_N$ is full-rank.

This result holds for N=2. For example, with $$G_2 = \begin{bmatrix} 1 & g_1 \\ 0 & 1 \end{bmatrix},$$

Equation (35) may be determined.

$$G_2^{-1} = \begin{bmatrix} 1 & \alpha_1 \\ 0 & 1 \end{bmatrix} \text{ where } \alpha_1 = g_1. \qquad (35)$$

I may be assumed that the result holds for N and it may be proven that the result also holds for N+1, as shown in Equations (36) and (37) below.

$$G_{N+1} = \begin{bmatrix} G_N & \begin{bmatrix} 0 \\ g_m \\ \vdots \\ g_1 \end{bmatrix} \\ 0 & g_0 \end{bmatrix} \qquad (36)$$

$$G_N = \begin{bmatrix} g_0 & \cdots & g_m & 0 & \cdots & 0 \\ 0 & g_0 & \cdots & g_m & 0 & 0 \\ 0 & 0 & g_0 & \cdots & g_m & 0 \\ 0 & 0 & 0 & g_0 & \cdots & g_m \\ 0 & 0 & 0 & 0 & g_0 & \cdots \\ 0 & 0 & 0 & 0 & 0 & g_0 \end{bmatrix} \qquad (37)$$

The inverse of $G_{N+1}$ may be written as Equation (38) below.

$$G_{N+1}^{-1} = \begin{bmatrix} B_N & c \\ 0 & d \end{bmatrix} \qquad (38)$$

The goal is to find $B_N$, c and d. Since $$G_{N+1}^{-1} G_{N+1} = I_{N+1},$$

this results in Equation (39) below.

$$\begin{bmatrix} B_N & c \\ 0 & d \end{bmatrix} \begin{bmatrix} G_N & \begin{bmatrix} 0 \\ g_m \\ \vdots \\ g_1 \end{bmatrix} \\ 0 & g_0 \end{bmatrix} = I_{N+1} \qquad (39)$$

This results in Equation (40), (41), and (42), given that $g_0$ 1.

$$B_N G_N = I_N \rightarrow B_N = G_N^{-1} \qquad (40)$$

$$B_N \begin{bmatrix} 0 \\ g_m \\ \vdots \\ g_1 \end{bmatrix} + c = 0_{N \times 1} \rightarrow c = G_N^{-1} \begin{bmatrix} 0 \\ g_m \\ \vdots \\ g_1 \end{bmatrix} \qquad (41)$$

$$dg_0 = 1 \rightarrow d = 1 = \alpha_0 \qquad (42)$$

From Equations (40)-(42), this results in Equation (43) below.

$$G_{N+1}^{-1} = \begin{bmatrix} G_N^{-1} & G_N^{-1}\begin{bmatrix} 0 \\ g_m \\ \vdots \\ g_1 \end{bmatrix} \\ 0 & \alpha_0 \end{bmatrix} = \begin{bmatrix} \begin{bmatrix} \alpha_0 & \dots & \alpha_m & 0 & \dots & \alpha_{N-1} \\ 0 & \alpha_0 & \dots & \alpha_m & 0 & \vdots \\ 0 & 0 & \alpha_0 & \dots & \alpha_m & 0 \\ 0 & 0 & 0 & \alpha_0 & \dots & \alpha_m \\ 0 & 0 & 0 & 0 & \alpha_0 & \dots \\ 0 & 0 & 0 & 0 & 0 & \alpha_0 \end{bmatrix} \\ 0 \end{bmatrix} \tag{43}$$

$$\begin{bmatrix} \begin{bmatrix} \alpha_0 & \dots & \alpha_m & 0 & \dots & \alpha_{N-1} \\ 0 & \alpha_0 & \dots & \alpha_m & 0 & \vdots \\ 0 & 0 & \alpha_0 & \dots & \alpha_m & 0 \\ 0 & 0 & 0 & \alpha_0 & \dots & \alpha_m \\ 0 & 0 & 0 & 0 & \alpha_0 & \dots \\ 0 & 0 & 0 & 0 & 0 & \alpha_0 \end{bmatrix} \begin{bmatrix} 0 \\ g_m \\ \vdots \\ g_1 \end{bmatrix} \\ \alpha_0 \end{bmatrix}$$

where $\alpha_0=1$. To complete the proof, it suffices to show Equation (44) below.

$$c = \begin{bmatrix} c_1 \\ c_2 \\ \vdots \\ c_N \end{bmatrix} = \begin{bmatrix} \alpha_0 & \dots & \alpha_m & 0 & \dots & \alpha_{N-1} \\ 0 & \alpha_0 & \dots & \alpha_m & 0 & \vdots \\ 0 & 0 & \alpha_0 & \dots & \alpha_m & 0 \\ 0 & 0 & 0 & \alpha_0 & \dots & \alpha_m \\ 0 & 0 & 0 & 0 & \alpha_0 & \dots \\ 0 & 0 & 0 & 0 & 0 & \alpha_0 \end{bmatrix}\begin{bmatrix} 0 \\ g_m \\ \vdots \\ g_1 \end{bmatrix} = \begin{bmatrix} \alpha_N \\ \alpha_{N-1} \\ \vdots \\ \alpha_1 \end{bmatrix} \tag{44}$$

For any $\alpha_N$, it may be determined that $c_j=\alpha_{N-j+1}$ for $2 \le j \le N$, resulting in Equation (45) below.

$$c_j = [0, \alpha_0, \dots, \alpha_{N-j}]\begin{bmatrix} 0 \\ g_m \\ \vdots \\ g_1 \end{bmatrix} \tag{45}$$

From $$G_N^{-1} G_N = I_N$$

(considering the first $N-1$ rows), Equations (46) results in Equation (47) below.

$$[0, \alpha_0, \dots, \alpha_{N-j+1}]\begin{bmatrix} 0 \\ g_m \\ \vdots \\ g_1 \\ g_0 \end{bmatrix} = 0, \text{ for } 2 \le j \le N \tag{46}$$

$$[0, \alpha_0, \dots, \alpha_{N-j}]\begin{bmatrix} 0 \\ g_m \\ \vdots \\ g_1 \end{bmatrix} + \alpha_{N-j+1}g_0 = 0 \tag{47}$$

Alternatively, this results in Equation (48) below.

$$c_j + \alpha_{N-j+1} = 0 \rightarrow c_j = \alpha_{N-j+1} \text{ for } 2 \le j \le N \tag{48}$$

The inverse CC generator polynomial for different special node lengths may be nested. Equation (49) is shown below for length 2, 4, 8 16 rate-1 special nodes.

$$G_{inv,CC} = \begin{bmatrix} 1 & 0 & 0 & 0 & 0 & 0 & 0 & 0 & 0 & 0 & 0 & 0 & 0 & 0 & 0 & 0 \\ 1 & 0 & 1 & 1 & 0 & 0 & 0 & 0 & 0 & 0 & 0 & 0 & 0 & 0 & 0 & 0 \\ 1 & 0 & 1 & 1 & 1 & 1 & 1 & 1 & 0 & 0 & 0 & 0 & 0 & 0 & 0 & 0 \\ 1 & 0 & 1 & 1 & 1 & 1 & 1 & 1 & 1 & 0 & 0 & 1 & 0 & 1 & 0 & 1 \end{bmatrix}$$

A CC generator and inverse generator matrix of length $N=2^n$ special node may take the form shown in Equations (50) and (51) below.

$$G_{CC,n} = \begin{bmatrix} g_0 & \dots & g_m & 0 & \dots & 0 \\ 0 & g_0 & \dots & g_m & 0 & 0 \\ 0 & 0 & g_0 & \dots & g_m & 0 \\ 0 & 0 & 0 & g_0 & \dots & g_m \\ 0 & 0 & 0 & 0 & g_0 & \dots \\ 0 & 0 & 0 & 0 & 0 & g_0 \end{bmatrix} \tag{50}$$

$$G_{CC,n}^{-1} = \begin{bmatrix} \alpha_0 & \dots & \alpha_m & 0 & \dots & \alpha_{N-1} \\ 0 & \alpha_0 & \dots & \alpha_m & 0 & \vdots \\ 0 & 0 & \alpha_0 & \dots & \alpha_m & 0 \\ 0 & 0 & 0 & \alpha_0 & \dots & \alpha_m \\ 0 & 0 & 0 & 0 & \alpha_0 & \dots \\ 0 & 0 & 0 & 0 & 0 & \alpha_0 \end{bmatrix} \tag{51}$$

The generator polynomial and inverse generator polynomial may be $(g_0, \dots, g_m)$ and $(\alpha_0, \dots, \alpha_{N-1})$, respectively.

$$G_{CC,n+1}^{-1}$$

may be calculated and the first N elements of the first row may be equal to the first row of $$G_{CC,n}^{-1},$$

as shown in Equation (52) below.

$$G_{CC,n+1} = \begin{bmatrix} G_{CC,n} & A \\ 0 & G_{CC,n} \end{bmatrix} \tag{52}$$

$$G_{CC,n+1}^{-1}$$

may take the form shown in Equation (53) below.

$$G_{CC,n+1}^{-1} = \begin{bmatrix} B & C \\ 0 & D \end{bmatrix} \tag{53}$$

B may be calculated and compared with $$G_{CC,n}^{-1}.$$

$I_n$ may be set to the identity matrix of size $2^n \times 2^n$, resulting in Equation (54) or (55) below.

$$G_{CC,n+1}^{-1} \cdot G_{CC,n+1} = I_{n+1} \rightarrow \begin{bmatrix} B & C \\ 0 & D \end{bmatrix} \begin{bmatrix} G_{CC,n} & A \\ 0 & G_{CC,n} \end{bmatrix} = \begin{bmatrix} I_n & 0 \\ 0 & I_n \end{bmatrix} \quad (54)$$

$$\begin{bmatrix} B \cdot G_{CC,n} & B \cdot A + C \cdot G_{CC,n} \\ 0 & D \cdot G_{CC,n} \end{bmatrix} = \begin{bmatrix} I_n & 0 \\ 0 & I_n \end{bmatrix} \quad (55)$$

This results in Equation (56) below.

$$B \cdot G_{CC,n} = I_n \quad (56)$$

This may be alternatively set forth as $$B = G_{CC,n}^{-1}$$

which means that the first row of B is equal to the first row of $$G_{CC,n}^{-1},$$

i.e., $(\alpha_0 \dots, \alpha_{N-1})$. Therefore, the first N elements of the first row of $$G_{CC,n+1}^{-1}$$

are equal to the first row of $$G_{CC,n}^{-1},$$

and this proves the nested property of inverse CC generator polynomial.

With the above property, one inverse shift registers of length $N=2^n$ may be sufficient for the PAC decoder inverse CC operations. When operating at a given special node of length M, only the first M memory elements of the shift register may be taken (e.g., the first L≤elements where L is the position of the last "1" in the inverse polynomial).

Figure 5:
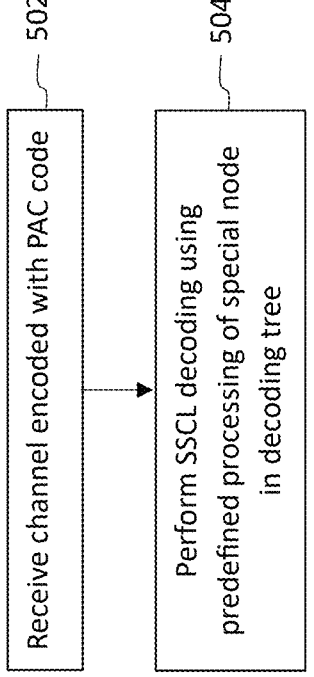
FIG. 5 is a flowchart illustrating a method of SSCL decoding of a PAC code, according to an embodiment.

FIG. 5 is a flowchart illustrating a method of SSCL decoding of a PAC code, according to an embodiment.

At 502, a receiver of an electronic device receives a channel encoded with a PAC code. At 504, a decoder of the electronic device performs SSCL decoding on the channel via a decoding tree to generate a decoded codeword. The decoding tree includes a special node that generates candidate codeword output based on predefined processing using CC state input and channel vector input, without processing a sub-tree of the special node. The special node may be a rate-0 node, a repetition node, a rate-1 node, and an SPC node, and the predefined processing is described in detail above.

Figure 6:
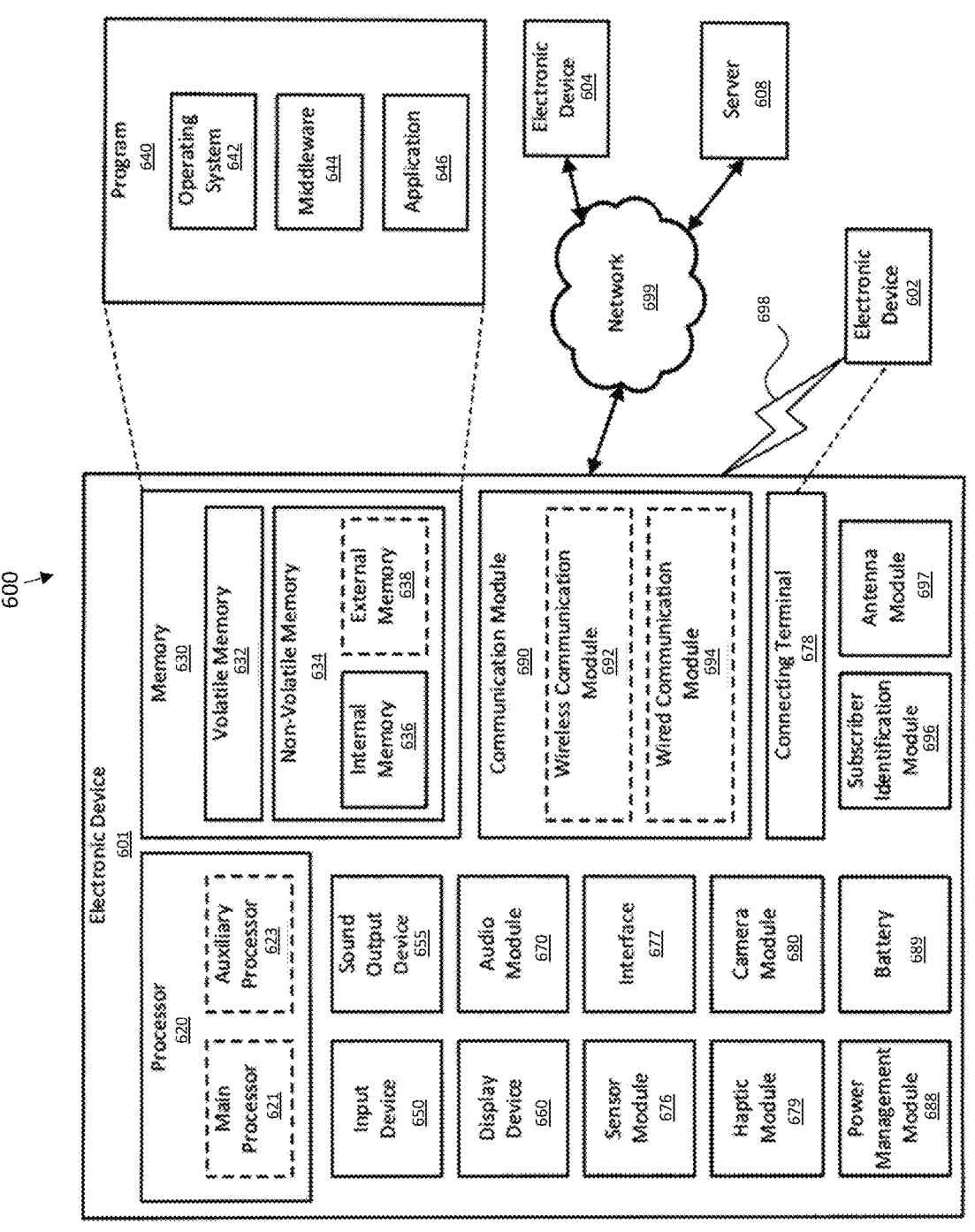
FIG. 6 is a block diagram of an electronic device in a network environment, according to an embodiment.

FIG. 6 is a block diagram of an electronic device in a network environment 600, according to an embodiment.

Referring to FIG. 6, an electronic device 601 in a network environment 600 may communicate with an electronic device 602 via a first network 698 (e.g., a short-range wireless communication network), or an electronic device 604 or a server 608 via a second network 699 (e.g., a long-range wireless communication network). The electronic device 601 may communicate with the electronic device 604 via the server 608. The electronic device 601 may include a processor 620, a memory 630, an input device 650, a sound output device 655, a display device 660, an audio module 670, a sensor module 676, an interface 677, a haptic module 679, a camera module 680, a power management module 688, a battery 689, a communication module 690, a subscriber identification module (SIM) card 696, or an antenna module 697. In one embodiment, at least one (e.g., the display device 660 or the camera module 680) of the components may be omitted from the electronic device 601, or one or more other components may be added to the electronic device 601. Some of the components may be implemented as a single integrated circuit (IC). For example, the sensor module 676 (e.g., a fingerprint sensor, an iris sensor, or an illuminance sensor) may be embedded in the display device 660 (e.g., a display).

The processor 620 may execute software (e.g., a program 640) to control at least one other component (e.g., a hardware or a software component) of the electronic device 601 coupled with the processor 620 and may perform various data processing or computations.

As at least part of the data processing or computations, the processor 620 may load a command or data received from another component (e.g., the sensor module 676 or the communication module 690) in volatile memory 632, process the command or the data stored in the volatile memory 632, and store resulting data in non-volatile memory 634. The processor 620 may include a main processor 621 (e.g., a central processing unit (CPU) or an application processor (AP)), and an auxiliary processor 623 (e.g., a graphics processing unit (GPU), an image signal processor (ISP), a sensor hub processor, or a communication processor (CP)) that is operable independently from, or in conjunction with, the main processor 621. Additionally or alternatively, the auxiliary processor 623 may be adapted to consume less power than the main processor 621, or execute a particular function. The auxiliary processor 623 may be implemented as being separate from, or a part of, the main processor 621.

The auxiliary processor 623 may control at least some of the functions or states related to at least one component (e.g., the display device 660, the sensor module 676, or the communication module 690) among the components of the electronic device 601, instead of the main processor 621 while the main processor 621 is in an inactive (e.g., sleep) state, or together with the main processor 621 while the main processor 621 is in an active state (e.g., executing an application). The auxiliary processor 623 (e.g., an image signal processor or a communication processor) may be implemented as part of another component (e.g., the camera module 680 or the communication module 690) functionally related to the auxiliary processor 623.

The memory 630 may store various data used by at least one component (e.g., the processor 620 or the sensor module 676) of the electronic device 601. The various data may include, for example, software (e.g., the program 640) and input data or output data for a command related thereto. The memory 630 may include the volatile memory 632 or the non-volatile memory 634. Non-volatile memory 634 may include internal memory 636 and/or external memory 638.

The program 640 may be stored in the memory 630 as software, and may include, for example, an operating system (OS) 642, middleware 644, or an application 646.

The input device 650 may receive a command or data to be used by another component (e.g., the processor 620) of the electronic device 601, from the outside (e.g., a user) of the electronic device 601. The input device 650 may include, for example, a microphone, a mouse, or a keyboard.

The sound output device 655 may output sound signals to the outside of the electronic device 601. The sound output device 655 may include, for example, a speaker or a receiver. The speaker may be used for general purposes, such as playing multimedia or recording, and the receiver may be used for receiving an incoming call. The receiver may be implemented as being separate from, or a part of, the speaker.

The display device 660 may visually provide information to the outside (e.g., a user) of the electronic device 601. The display device 660 may include, for example, a display, a hologram device, or a projector and control circuitry to control a corresponding one of the display, hologram device, and projector. The display device 660 may include touch circuitry adapted to detect a touch, or sensor circuitry (e.g., a pressure sensor) adapted to measure the intensity of force incurred by the touch.

The audio module 670 may convert a sound into an electrical signal and vice versa. The audio module 670 may obtain the sound via the input device 650 or output the sound via the sound output device 655 or a headphone of an external electronic device 602 directly (e.g., wired) or wirelessly coupled with the electronic device 601.

The sensor module 676 may detect an operational state (e.g., power or temperature) of the electronic device 601 or an environmental state (e.g., a state of a user) external to the electronic device 601, and then generate an electrical signal or data value corresponding to the detected state. The sensor module 676 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 677 may support one or more specified protocols to be used for the electronic device 601 to be coupled with the external electronic device 602 directly (e.g., wired) or wirelessly. The interface 677 may include, for example, a high-definition multimedia interface (HDMI), a universal serial bus (USB) interface, a secure digital (SD) card interface, or an audio interface.

A connecting terminal 678 may include a connector via which the electronic device 601 may be physically connected with the external electronic device 602. The connecting terminal 678 may include, for example, an HDMI connector, a USB connector, an SD card connector, or an audio connector (e.g., a headphone connector).

The haptic module 679 may convert an electrical signal into a mechanical stimulus (e.g., a vibration or a movement) or an electrical stimulus which may be recognized by a user via tactile sensation or kinesthetic sensation. The haptic module 679 may include, for example, a motor, a piezoelectric element, or an electrical stimulator.

The camera module 680 may capture a still image or moving images. The camera module 680 may include one or more lenses, image sensors, image signal processors, or flashes. The power management module 688 may manage power supplied to the electronic device 601. The power management module 688 may be implemented as at least part of, for example, a power management integrated circuit (PMIC).

The battery 689 may supply power to at least one component of the electronic device 601. The battery 689 may include, for example, a primary cell which is not rechargeable, a secondary cell which is rechargeable, or a fuel cell.

The communication module 690 may support establishing a direct (e.g., wired) communication channel or a wireless communication channel between the electronic device 601 and the external electronic device (e.g., the electronic device 602, the electronic device 604, or the server 608) and performing communication via the established communication channel. The communication module 690 may include one or more communication processors that are operable independently from the processor 620 (e.g., the AP) and supports a direct (e.g., wired) communication or a wireless communication. The communication module 690 may include a wireless communication module 692 (e.g., a cellular communication module, a short-range wireless communication module, or a global navigation satellite system (GNSS) communication module) or a wired communication module 694 (e.g., a local area network (LAN) communication module or a power line communication (PLC) module). A corresponding one of these communication modules may communicate with the external electronic device via the first network 698 (e.g., a short-range communication network, such as BLUETOOTH™, wireless-fidelity (Wi-Fi) direct, or a standard of the Infrared Data Association (IrDA)) or the second network 699 (e.g., a long-range communication network, such as a cellular network, the Internet, or a computer network (e.g., LAN or wide area network (WAN)). These various types of communication modules may be implemented as a single component (e.g., a single IC), or may be implemented as multiple components (e.g., multiple ICs) that are separate from each other. The wireless communication module 692 may identify and authenticate the electronic device 601 in a communication network, such as the first network 698 or the second network 699, using subscriber information (e.g., international mobile subscriber identity (IMSI)) stored in the subscriber identification module 696.

The antenna module 697 may transmit or receive a signal or power to or from the outside (e.g., the external electronic device) of the electronic device 601. The antenna module 697 may include one or more antennas, and, therefrom, at least one antenna appropriate for a communication scheme used in the communication network, such as the first network 698 or the second network 699, may be selected, for example, by the communication module 690 (e.g., the wireless communication module 692). The signal or the power may then be transmitted or received between the communication module 690 and the external electronic device via the selected at least one antenna.

Commands or data may be transmitted or received between the electronic device 601 and the external electronic device 604 via the server 608 coupled with the second network 699. Each of the electronic devices 602 and 604 may be a device of a same type as, or a different type, from the electronic device 601. All or some of operations to be executed at the electronic device 601 may be executed at one or more of the external electronic devices 602, 604, or 608. For example, if the electronic device 601 should perform a function or a service automatically, or in response to a request from a user or another device, the electronic device 601, instead of, or in addition to, executing the function or the service, may request the one or more external electronic devices to perform at least part of the function or the service. The one or more external electronic devices receiving the request may perform the at least part of the function or the service requested, or an additional function or an additional service related to the request and transfer an outcome of the performing to the electronic device 601. The electronic device 601 may provide the outcome, with or without further processing of the outcome, as at least part of a reply to the request. To that end, a cloud computing, distributed computing, or client-server computing technology may be used, for example.

Embodiments of the subject matter and the operations described in this specification may be implemented in digital electronic circuitry, or in computer software, firmware, or hardware, including the structures disclosed in this specification and their structural equivalents, or in combinations of one or more of them. Embodiments of the subject matter described in this specification may be implemented as one or more computer programs, i.e., one or more modules of computer-program instructions, encoded on computer-storage medium for execution by, or to control the operation of data-processing apparatus. Alternatively or additionally, the program instructions can be encoded on an artificially-generated propagated signal, e.g., a machine-generated electrical, optical, or electromagnetic signal, which is generated to encode information for transmission to suitable receiver apparatus for execution by a data processing apparatus. A computer-storage medium can be, or be included in, a computer-readable storage device, a computer-readable storage substrate, a random or serial-access memory array or device, or a combination thereof. Moreover, while a computer-storage medium is not a propagated signal, a computer-storage medium may be a source or destination of computer-program instructions encoded in an artificially-generated propagated signal. The computer-storage medium can also be, or be included in, one or more separate physical components or media (e.g., multiple CDs, disks, or other storage devices). Additionally, the operations described in this specification may be implemented as operations performed by a data-processing apparatus on data stored on one or more computer-readable storage devices or received from other sources.

While this specification may contain many specific implementation details, the implementation details should not be construed as limitations on the scope of any claimed subject matter, but rather be construed as descriptions of features specific to particular embodiments. Certain features that are described in this specification in the context of separate embodiments may also be implemented in combination in a single embodiment. Conversely, various features that are described in the context of a single embodiment may also be implemented in multiple embodiments separately or in any suitable subcombination. Moreover, although features may be described above as acting in certain combinations and even initially claimed as such, one or more features from a claimed combination may in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Thus, particular embodiments of the subject matter have been described herein. Other embodiments are within the scope of the following claims. In some cases, the actions set forth in the claims may be performed in a different order and still achieve desirable results. Additionally, the processes depicted in the accompanying figures do not necessarily require the particular order shown, or sequential order, to achieve desirable results. In certain implementations, multitasking and parallel processing may be advantageous.

As will be recognized by those skilled in the art, the innovative concepts described herein may be modified and varied over a wide range of applications. Accordingly, the scope of claimed subject matter should not be limited to any of the specific exemplary teachings discussed above, but is instead defined by the following claims.

What is claimed is:

1. A method comprising:
receiving, at an electronic device, a signal comprising an encoded channel vector, wherein the encoded channel vector was encoding using a polarization-adjusted convolutional (PAC) code; and
generating a decoded codeword, wherein the decoded codeword is generated based at least in part on simplified successive cancellation list (SSCL) decoding performed, by the electronic device, on the received encoded channel vector via a decoding tree, wherein the decoding tree comprises a node that generates candidate codeword output based on predefined processing using convolutional code (CC) state input and the received encoded channel vector, and wherein a sub-tree of the node remains unprocessed, wherein:
the node comprises a rate-1 node, and each leaf node of the sub-tree comprises a one-valued bit; and
the candidate codeword output is generated based on a determination of an information-carrier vector from a CC codeword.

2. The method of claim 1, wherein:
the node comprises a rate-0 node, and each leaf node of the sub-tree comprises a zero-valued bit; and
the candidate codeword output comprises a constant codeword for each member of a list in the SSCL decoding.

3. The method of claim 1, wherein:
the node comprises a repetition node, a last leaf node of the sub-tree comprises a one-valued bit, and remaining leaf nodes of the sub-tree comprise zero-valued bits; and
the candidate codeword output comprises one of two constant codewords for each member of a list in the SSCL decoding.

4. The method of claim 1, wherein the candidate codeword output is based on a non-linear code.

5. The method of claim 1, wherein:
the node comprises a single parity check (SPC) node, a first leaf node of the sub-tree comprises a zero-valued bit, and remaining leaf nodes of the sub-tree comprise one-valued bits; and
the candidate codeword output is generated based on a least likelihood ratio (LLR) scrambling and a determination of an information-carrier vector from a CC codeword.

6. The method of claim 5, wherein the candidate codeword output is generated based on an SPC codebook.

7. The method of claim 1, further comprising applying inverse CC encoding for different lengths of the node.

8. The method of claim 1, wherein the node further generates CC state output, an information-carrier vector, and a CC codeword corresponding to the information-carrier vector.

9. The method of claim 1, wherein the SSCL decoding is performed with parallel successive cancellation (SC) decoders, a first list is maintained for an information-carrier vector, and a second list is maintained for a CC codeword.

10. The method of claim 1, wherein the received encoded channel vector comprises an LLR vector.

11. An electronic device comprising:
a receiver configured to receive a signal comprising an encoded channel vector, wherein the encoded channel vector was encoding using a polarization-adjusted convolutional (PAC) code; and
a decoder configured to generate a decoded codeword, wherein the decoded codeword is generated based at least in part on simplified successive cancellation list (SSCL) decoding performed on the received encoded channel vector via a decoding tree, wherein the decoding tree comprises a node that generates candidate codeword output based on predefined processing using convolutional code (CC) state input and the received encoded channel vector, and wherein a sub-tree of the node remains unprocessed,
wherein the decoder is further configured to apply inverse CC encoding for different lengths of the node.

12. The electronic device of claim 11, wherein:
the node comprises a rate-0 node, and each leaf node of the sub-tree comprises a zero-valued bit; and
the candidate codeword output comprises a constant codeword for each member of a list in the SSCL decoding.

13. The electronic device of claim 11, wherein:
the node comprises a repetition node, a last leaf node of the sub-tree comprises a one-valued bit, and remaining leaf nodes of the sub-tree comprise zero-valued bits; and
the candidate codeword output comprises one of two constant codewords for each member of a list in the SSCL decoding.

14. The electronic device of claim 11, wherein:
the node comprises a rate-1 node, and each leaf node of the sub-tree comprises a one-valued bit; and
the candidate codeword output is generated based on a determination of an information-carrier vector from a CC codeword.

15. The electronic device of claim 14, wherein the candidate codeword output is based on a non-linear code.

16. The electronic device of claim 11, wherein:
the node comprises a single parity check (SPC) node, a first leaf node of the sub-tree comprises a zero-valued bit, and remaining leaf nodes of the sub-tree comprise one-valued bits; and
the candidate codeword output is generated based on a least likelihood ratio (LLR) scrambling and a determination of an information-carrier vector from a CC codeword.

17. The electronic device of claim 11, wherein the node further generates CC state output, an information-carrier vector, and a CC codeword corresponding to the information-carrier vector.

18. An electronic device comprising:
a processor; and
a non-transitory computer readable storage medium storing instructions that, when executed, cause the processor to:
receive a signal comprising an encoded channel vector, wherein the encoded channel vector was encoding using a polarization-adjusted convolutional (PAC) code; and
generate a decoded codeword, wherein the decoded codeword is generated based at least in part on simplified successive cancellation list (SSCL) decoding performed on the received encoded channel vector via a decoding tree, wherein the decoding tree comprises a node that generates candidate codeword output based on predefined processing using convolutional code (CC) state input and the received encoded channel vector, and wherein a sub-tree of the node remains unprocessed, wherein:
the node comprises a single parity check (SPC) node, a first leaf node of the sub-tree comprises a zero-valued bit, and remaining leaf nodes of the sub-tree comprise one-valued bits; and
the candidate codeword output is generated based on a least likelihood ratio (LLR) scrambling and a determination of an information-carrier vector from a CC codeword.

* * * * *